United States Patent

Shang et al.

[11] Patent Number: 6,055,927
[45] Date of Patent: *May 2, 2000

[54] APPARATUS AND METHOD FOR WHITE POWDER REDUCTION IN SILICON NITRIDE DEPOSITION USING REMOTE PLASMA SOURCE CLEANING TECHNOLOGY

[75] Inventors: Quanyuan Shang, San Jose; Robert McCormick Robertson, Santa Clara; Kam S. Law, Union City; Dan Maydan, Los Altos Hills, all of Calif.

[73] Assignee: Applied Komatsu Technology, Inc., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/782,169

[22] Filed: Jan. 14, 1997

[51] Int. Cl.$^7$ .................................................. C23C 16/00
[52] U.S. Cl. ............................ 118/723 ME; 118/723 E; 118/723 ER; 118/723 I; 118/723 MP; 118/724; 118/725; 118/715; 134/104.1
[58] Field of Search ......................... 118/723 E, 723 ER, 118/723 IR, 723 ME, 723 MP, 724, 725, 715; 134/1.1, 104.1

[56] References Cited

U.S. PATENT DOCUMENTS

| | | | |
|---|---|---|---|
| 4,051,382 | 9/1977 | Ogawa et al. | 250/531 |
| 4,446,815 | 5/1984 | Kalbskopf et al. | 118/718 |
| 4,461,783 | 7/1984 | Yamazaki et al. | 427/39 |
| 4,624,214 | 11/1986 | Suzuki et al. | 118/719 |
| 4,724,160 | 2/1988 | Arvidson et al. | 437/225 |
| 4,771,730 | 9/1988 | Tezuka | 118/723 E |
| 5,015,330 | 5/1991 | Okumura et al. | 156/643 |
| 5,154,135 | 10/1992 | Ishihara | 118/719 |
| 5,254,171 | 10/1993 | Hayakawa et al. | 118/723 MR |
| 5,366,585 | 11/1994 | Robertson et al. | 156/345 |
| 5,449,444 | 9/1995 | Yoshikawa | 204/192.12 |
| 5,453,125 | 9/1995 | Krogh | 118/723 MR |
| 5,472,508 | 12/1995 | Saxena | 118/723 E |
| 5,558,717 | 9/1996 | Zhao et al. | 118/715 |
| 5,651,826 | 7/1997 | Takagi | 118/724 |
| 5,653,806 | 8/1997 | Van Buskirk | 118/715 |
| 5,788,778 | 8/1998 | Shang et al. | 134/1 |
| 5,804,923 | 9/1998 | Iio et al. | 315/111.21 |
| 5,812,403 | 9/1998 | Fong et al. | 364/468.28 |
| 5,834,371 | 11/1998 | Ameen et al. | 438/656 |
| 5,846,332 | 12/1998 | Zhao et al. | 118/728 |
| 5,882,411 | 3/1999 | Zhao et al. | 118/715 |
| 5,895,548 | 4/1999 | Ettinger et al. | 156/345 |

FOREIGN PATENT DOCUMENTS

| | | | |
|---|---|---|---|
| 61-88527 | 5/1986 | Japan | 118/723 ME |
| 2-138735 | 5/1990 | Japan | 118/723 ME |

*Primary Examiner*—Jeffrie R Lund
*Attorney, Agent, or Firm*—Birgit E. Morris

[57] ABSTRACT

An apparatus and method for reducing the production of white powder in a process chamber used for depositing silicon nitride. Steps of the method include heating at least a portion of a wall of the process chamber; providing a liner covering a substantial portion of a wall of the process chamber; providing a remote chamber connected to the interior of the process chamber; causing a plasma of cleaning gas in the remote chamber; and flowing a portion of the plasma of cleaning gas into the process chamber. The apparatus includes a deposition chamber having walls; means for heating the walls, the means thermally coupled to the walls; a liner covering a substantial portion of the walls; a remote chamber disposed outside of the chamber; an activation source adapted to deliver energy into the remote chamber; a first conduit for flowing a precursor gas from a remote gas supply into the remote chamber where it is activated by the activation source to form a reactive species; and a second conduit for flowing the reactive species from the remote chamber into the deposition chamber.

15 Claims, 2 Drawing Sheets

APPARATUS AND METHOD FOR WHITE POWDER REDUCTION IN SILICON NITRIDE DEPOSITION USING REMOTE PLASMA SOURCE CLEANING TECHNOLOGY

BACKGROUND OF THE INVENTION

Plasma-assisted chemical reactions have been widely used in the semiconductor and flat panel display industries. One example is plasma-enhanced chemical vapor deposition (PECVD), which is a process that is used in the manufacture of thin film transistors (TFT) for active-matrix liquid crystal displays (AMLCDs). In accordance with PECVD, a substrate is placed in a vacuum deposition chamber that is equipped with a pair of parallel plate electrodes. One of the electrodes, e.g. the lower electrode, generally referred to as a susceptor, holds the substrate. The other electrode, i.e., the upper electrode, functions as a gas inlet manifold or shower head. During deposition, a reactant gas flows into the chamber through the upper electrode and a radio frequency (RF) voltage is applied between the electrodes to produce a plasma within the reactant gas. The plasma causes the reactant gas to decompose and deposit a layer of material onto the surface of the substrate.

One material often deposited is silicon nitride (SiN). SiN is a common material for a gate insulation layer and also for passivation layers due to its ability to resist moisture and sodium contamination. In SiN deposition, as described in U.S. Pat. No. 5,399,387, assigned to the assignee of the present invention and herein incorporated by reference, a plasma of silane ($SiH_4$) and ammonia ($NH_3$) gases may be used to deposit SiN according to several reaction paths, for example:

$$SiH_4 + NH_3 \rightarrow SiNH + 3H_2$$

$$3SiH_4 + 4NH_3 \rightarrow Si_3N_4 + 12H_2$$

SiN not only deposits on the substrate but also deposits on the walls and the pumping system. A known in-situ cleaning process may remove the SiN film from the walls by supplying a cleaning gas, often nitrogen fluoride ($NF_3$), and activating the gas inside the chamber using an RF plasma in order to form pumpable volatile products. This reaction may proceed as follows:

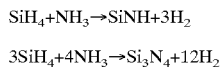

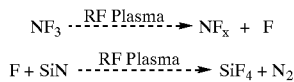

The product silicon fluoride ($SiF_4$) may then react with $NH_3$ and hydrogen fluoride (HF) in the SiN deposition process to form, for example, ammonium hexafluoride (($NH_4$)$_2SiF_6$). Such products and other similar silicon-containing fluoride products are referred to herein as "white powder", and more generally constitute partially reacted SiN films. This undesirable white powder can condense, for example, in the vacuum pump. The white powder can also condense in the vacuum line connecting the process chamber to the pump (the foreline) and in the vacuum line connecting the pump to the exhaust system (the exhaust line). Finally, the white powder can also condense in the burn box (which treats the exhaust) and on the chamber walls. In the case of the pump and exhaust, the condensation can amount to several kilograms of white powder, often causing pump failure. In the case of the foreline and exhaust line, clogging can occur. The white powder is also a source of undesirable particulates in deposition processes.

Prior plasma in-situ cleaning processes are ineffective at removing the white powder or reducing its occurrence in SiN deposition. In such systems for cleaning the chamber and the exposed components within the chamber, precursor gases are supplied to the chamber. Then, by locally applying a glow discharge plasma to the precursor gases within the chamber, reactive species are generated. The reactive species clean the chamber surfaces by forming volatile compounds with the process deposit on those surfaces. This plasma in-situ cleaning generally does not remove the white powder, regular maintenance of the pump and exhaust is still required.

New enhanced cleaning systems are developed for removing the white powder. For example, some enhanced systems introduce an additional plasma source between the process chamber and the pump. In another example, traps are introduced between the pump and the process chamber or after the pump (in the exhaust line). However, these methods are also ineffective at removing the white powder or reducing its occurrence in SiN deposition.

It is an object of the present invention to reduce the amount of white powder formed during SiN deposition processes. It is a related object to reduce the damage to components that may occur as a result of white powder formation.

SUMMARY OF THE INVENTION

In one aspect, the invention is directed to a method for reducing the production of white powder in a process chamber used for depositing silicon nitride, comprising the steps of heating at least a portion of a wall of the process chamber; providing a liner covering a substantial portion of a wall of the process chamber; providing a remote chamber connected to the interior of the process chamber; causing a plasma of cleaning gas in the remote chamber; and flowing a portion of the plasma of cleaning gas into the process chamber, such that the production of white powder is substantially reduced.

Implementations of the invention include the following. The heating step is performed by flowing a heated fluid in at least one hollow compartment within the wall. The production of white powder is reduced in a vacuum line and a pumping system serving the process chamber. The heated fluid is substantially water. The method may further comprise the step of heating the water to a temperature of about 85° C. or greater than about 85° C. The liner covers substantially the entire interior portion of the process chamber. The liner is made of anodized aluminum or of a ceramic.

In another aspect, the invention is directed to a method for reducing the production of white powder in a process chamber used for depositing silicon nitride, comprising the steps of providing means for heating the walls of the process chamber and providing a liner covering a substantial portion of the interior of the process chamber, such that the production of white powder is substantially reduced.

Implementations of the invention include the following. The heating means is a thermally insulating blanket substantially covering the exterior of the process chamber or a resistive heater.

In another aspect, the invention is directed to an apparatus for silicon nitride deposition in which the production of white powder is reduced. The invention comprises a deposition chamber having walls; means for heating the walls, the means thermally coupled to the walls; a liner covering a substantial portion of the walls; a remote chamber disposed outside of the chamber; an activation source adapted to deliver energy into the remote chamber; a first conduit for flowing a precursor gas from a remote gas supply into the remote chamber where it is activated by the activation source to form a reactive species; and a second conduit for flowing the reactive species from the remote chamber into the deposition chamber.

Implementations of the invention include the following. The heating means includes a compartment located within at least a portion of the wall; a fluid inlet port connected to the compartment; and a fluid outlet port connected to the compartment. There is also a source of fluid connected to the fluid inlet port. The heating means may also be a thermally insulating blanket substantially covering the exterior of the chamber.

It is an advantage of the present invention that the amount of white powder produced in SiN deposition processes is reduced. It is a further advantage that the occurrences of pump failure and line clogging caused by white powder are reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

BRIEF DESCRIPTION OF THE DRAWINGS

The accompanying drawings, which are incorporated in and constitute a part of the specification, schematically illustrate the invention and, together with the general description given above and the detailed description given below, serve to explain the principles of the invention.

DESCRIPTION OF THE PREFERRED EMBODIMENTS

In the described embodiment, we used a model AKT-3500 PECVD System, manufactured by Applied Komatsu Technology of Santa Clara, Calif., modified as described herein. The AKT-3500 PECVD is designed for use in the production of AMLCDs. It is a modular system with multiple process chambers which can be used for depositing amorphous silicon, SiN, silicon oxide and oxynitride films. More details regarding the system may be found in U.S. Pat. No. 5,788,778, assigned to the assignee of the present invention and herein incorporated by reference. The invention, however, may be used with any commercially-available deposition system.

Figure 1:
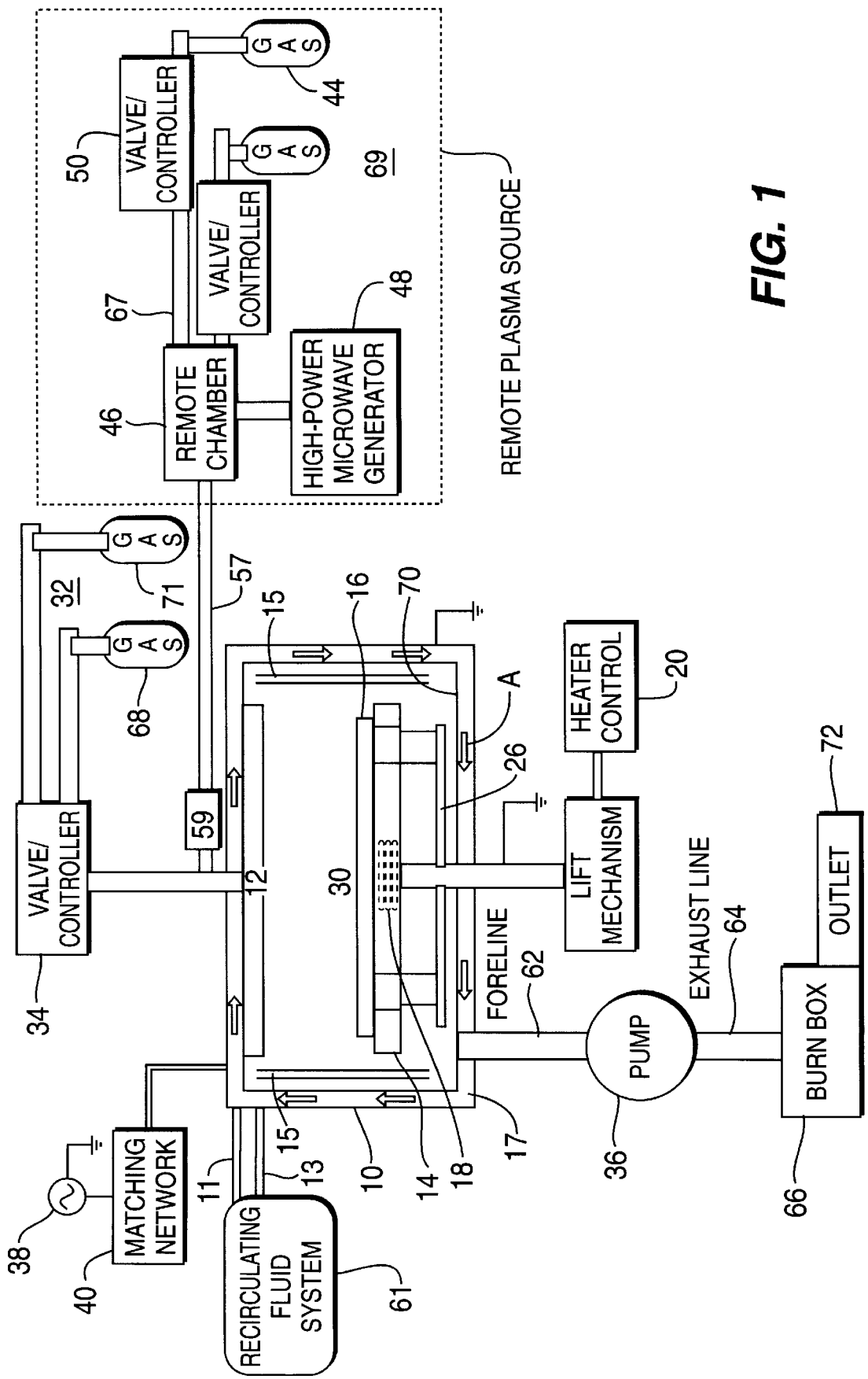
FIG. 1 shows a block diagram of a high power PECVD remote plasma cleaning system which embodies the invention.

Referring to FIG. 1, the PECVD system modified in accordance with the present invention includes a deposition chamber 10 inside of which is a gas inlet manifold (or shower head) 12 for introducing deposition gases, and a susceptor 14 for holding a substrate 16 onto which material is to be deposited. Inlet manifold 12 and susceptor 14, which are both in the form of parallel plates, also function as upper and lower electrodes, respectively. The lower electrode and the chamber body are connected to ground. An RF generator 38 supplies power to the upper electrode through a matching network 40. RF generator 38 is used to generate a plasma between the upper and lower electrodes.

The pumping system includes foreline 62, exhaust line 64, pump 36, burn box 66 and outlet 72. Gas to be pumped enters foreline 62 via random movement within chamber 10. This gas is removed by pump 36 and is exhausted from pump 36 by exhaust line 64. Burn box 66 treats the exhausted gases, which are then removed by an outlet 72. Burn box 66 is especially useful for burning oxygen and methane. Outlet 72 may connect to another pump or treatment facility or may be simply an outlet port to atmosphere.

Outside of chamber 10, there is a deposition gas system 32 containing the gases that are used during deposition. For SiN deposition, these gases are usually ammonia and silane. These are shown, for example, by ammonia gas supply 71 and silane gas supply 68. The process gases flow through an inlet port into the gas manifold and then into the chamber through the shower head. An electronically operated valve and flow control mechanism 34 controls the flow of gases from the gas supply into the chamber.

Chamber 10 includes a liner 15. In FIG. 1, liner 15 is depicted schematically as two parallel plates lining portions of interior walls 70 of the chamber. It is preferred that liner 15 substantially line the entirety of the interior walls 70 of chamber 10, even more preferably all of the chamber interior walls 70. Liner 15 may be made of, for example, anodized aluminum or a ceramic material. A ceramic liner which may be used is described in U.S. Pat. No. 5,366,585, assigned to the assignee of the present invention and herein incorporated by reference. Liner 15 is generally in physical and thermal contact with the interior walls of chamber 10.

Liner 15 is heated by convection, conduction, and radiation from at least three elements in and on the chamber. First, hot process gases within the deposition chamber tend to heat liner 15. These gases directly contact liner 15 and thus transfer energy directly by thermal conduction. Second, the heating of the susceptor creates a hot element within the chamber, and this heat is partially transferred to liner 15 by way of radiation and convection. Third, liner 15 may receive additional heating from the walls of the chamber, which are heated as described below. At typical process temperatures, which may be as high as about 370° C., liner 15 may reach temperatures of between about 150° C. up to about the temperature of the susceptor (370° C.), but is generally about 250° C. Generally, the effect of eliminating condensation is improved as the liner temperature increases. At the noted temperatures, condensation on liner 15 is reduced. These temperatures, it should be noted, are generally low enough that no chemical reactions occur with liner 15.

The walls of chamber 10 are independently heated. This is done for a number of reasons. First, liner 15 cannot eliminate all of the gas from striking the interior walls 70 of chamber 10. Thus, to stop cleaning gas particles from sticking to interior walls 70, the temperature of walls 70 is increased by heating so that any impinging gas particles do not condense on walls 70. A second reason for heating walls 70 is to enhance the heating of liner 15. As noted above, liner 15 receives some heat by thermal conduction from heated walls 70.

Walls 70 may be heated in a number of ways. The method by which they are heated is not critical. As one example, heating may be accomplished by resistive heaters thermally coupled to walls 70. Methods of such coupling are known to those skilled in the art.

In another embodiment, the walls of chamber 10 have a hollow portion 17 which is connected to inlet port 11 and outlet port 13. Using these ports, a recirculating fluid supply 61 flows heated gas or liquid through the chamber walls. For example, water may be used in a temperature range of about 75° C. up to its boiling point. In particular, water at a temperature of 85° C. may be used. The heated water then heats the chamber walls. A fluid flow is shown schematically in FIG. 1 by arrows "A". It is understood that the chamber flow system may include a series of fluidically-connected compartments that together form the hollow section or sections of chamber 10. That is, the walls may have hollow sections that define compartments. Fluid channels may connect the compartments, so that continuously flowing fluid into one compartment eventually leads to other compartments also being flushed with fluid. The design of such compartments may depend on the geometry and design of the walls of chamber 10. Preferably, substantially all of the interior walls are in close proximity to at least one hollow compartment.

The present invention is used with remote plasma source cleaning technology. In other words, the liner and heated walls are used in conjunction with the advantageous cleaning effects afforded by remote plasma source cleaning (as described in the patent application incorporated by reference above). The remote plasma source, used with the liner and heated walls, allows the production of white powder to be substantially reduced.

In an example of a remote plasma source cleaning system, a cleaning gas supply system 69 is also connected to the chamber through inlet port 33. The cleaning gas supply system supplies gas, such as $NF_3$, to clean the inside of the chamber after a sequence of deposition runs. One may also combine the first and second gas supplies if the gases are such that mixing is desired.

Cleaning gas system 69 includes a source of a precursor gas 44, an electronically-operated valve and flow control mechanism 50 for controlling the flow of precursor gas 44 and a first conduit 67 for flowing gas 44 into a remote activation chamber 46 which is located outside and at a distance from the deposition chamber. A power activation source, for example a high-power microwave generator 48, is used to activate the precursor gas within the remote activation chamber. A second conduit or pipe 57 connects the remote chamber 46 to the deposition chamber 10 via inlet port 33. A flow restrictor 59 is employed in pipe 57 to allow a pressure differential to be present between remote chamber 46 and deposition chamber 10. The remote chamber 46 may be a sapphire tube and the power source a 2.54 GHz microwave energy source with its output aimed at the sapphire tube.

In the described embodiment, the precursor gas is $NF_3$. The flow rate of activated species is about 2 liters per minute and the process chamber pressure is about 0.5 Torr. To activate the precursor gas, the microwave source delivers about 3,000–12,000 Watts to the remote activation chamber. A value of 5,000 Watts may be used for many applications.

Figure 2:
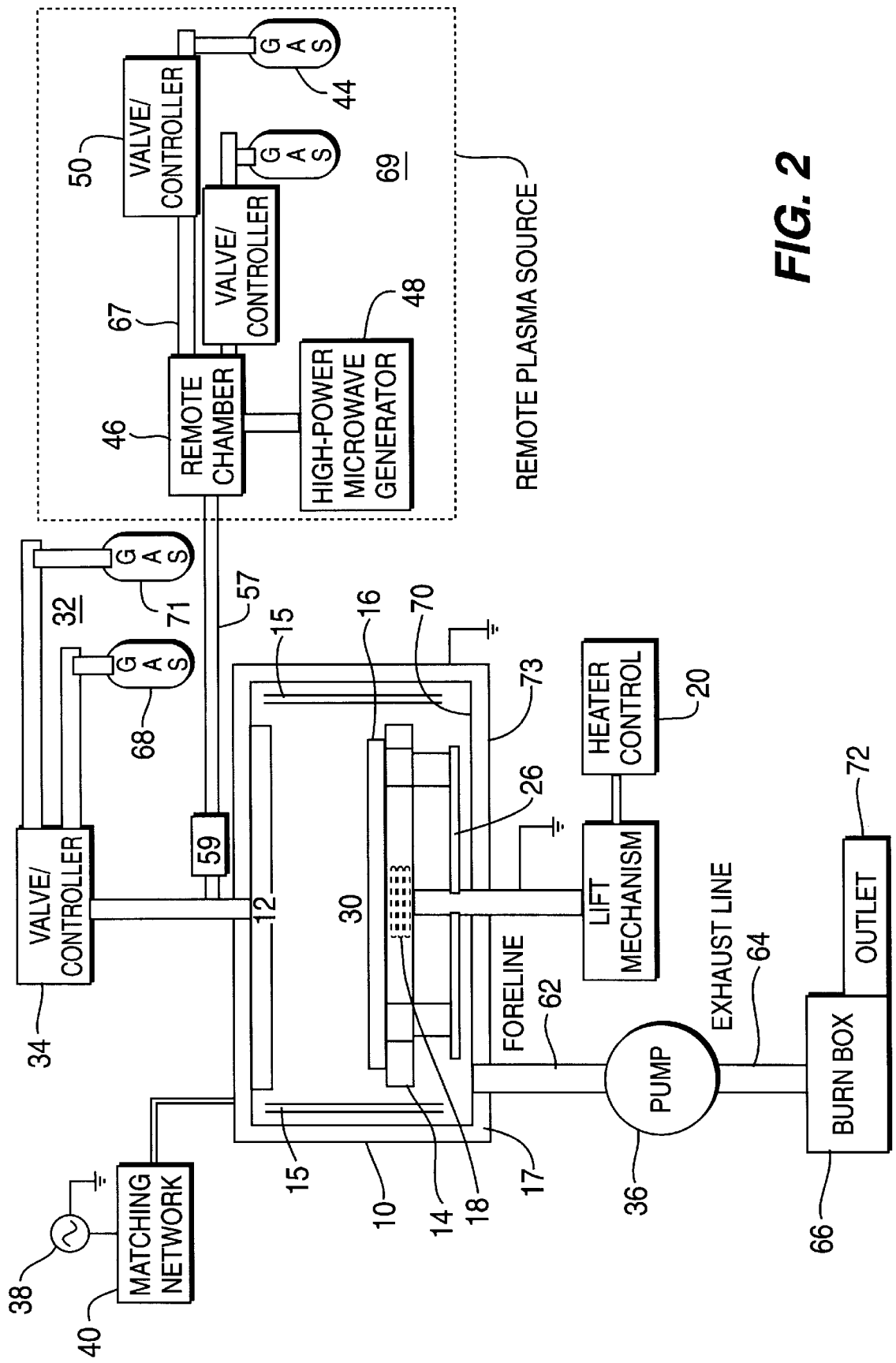
FIG. 2 shows a block diagram of a high power PECVD remote plasma cleaning system which embodies the invention in which a thermally-insulating blanket is used.

In another embodiment, as shown in FIG. 2, a thermal insulation blanket 73 may be used to cover the outside of chamber 10. In this embodiment, as shown in FIG. 2, blanket 73 serves to keep the heat generated by the process gases and susceptor within chamber 10. In other words, blanket 73 does not allow this heat to escape to the environment. Using blanket 73, interior walls 70 are heated because the usual path of heat dissipation is removed. This embodiment may be used with or without flowing fluid through the walls via recirculating fluid system 61.

In both embodiments, susceptor 14 includes a resistive heater 18 for heating the substrate during deposition. An external heater control module 20 powers the heaters to achieve and maintain the susceptor at an appropriate temperature level as dictated by the process being run in the system.

The action of the heated wall and liner in conjunction with a remote plasma source in the elimination of white powder may be at least partially explained as follows. Using the remote plasma source, the cleaning gas remains in the plasma state for a long period of time during which it travels long distances within the chamber (this feature is also explained in the patent application incorporated by reference above). As it travels long distances, it spreads out to distant parts of the chamber. For example, the gas particles can reach the pump while they are still in the plasma state. Thus, the particles can clean the areas adjacent to the pump, a primary collection point for white powder. Other distant sections of the chamber are similarly cleaned.

In addition to spreading throughout the chamber, the remote plasma system supplies an amount of cleaning gas that is greater than in prior systems. Thus, there is a greater amount of active plasma gas driving the chemical cleaning reactions to completion. Again, this explanation is understood to be a suggestion and is not to be taken as limiting.

Using the above system of a heated wall and liner with a remote plasma source has several advantages. For example, the amount of white powder formed in the system is reduced, particularly on foreline 62, exhaust line 64, pump 36, burn box 66, and chamber interior walls 70. This in turn leads to less pump and burn box failures than in earlier systems in which SiN was deposited.

In general, the reactive gas used for cleaning may be selected from a wide range of options, including the commonly used halogens and halogen compounds.

It should be understood that the power levels, flow rates, and pressures that are chosen are system-specific and thus they will need to be optimized for the particular system in which the process is being run. Making the appropriate adjustments in process conditions to achieve optimum performance for a particular system is well within the capabilities of a person of ordinary skill in the art.

The present invention has been described in terms of a preferred embodiment. The invention, however, is not limited to the embodiment depicted and described. Rather, the scope of the invention is defined by the appended claims.

What is claimed is:

1. An apparatus for silicon nitride deposition in which the production of white powder from a plurality of hot plasma gases inside a chamber is reduced comprising:

a plasma deposition chamber having walls;

a susceptor positioned inside said deposition chamber;

a heater for heating the susceptor;

means for heating said walls, said heating means being thermally coupled to said deposition chamber walls;

a liner covering a substantial portion of an inner surface of said deposition chamber walls and in thermal contact therewith, said liner being structured and arranged to be heated by conduction from said hot process gases, by radiation and convection from said susceptor, and by said deposition chamber walls when heated by the wall heating means;

a remote chamber disposed outside of and spaced apart from said deposition chamber;

a plasma activation source adapted to deliver energy into said remote chamber;

a first conduit configured to convey a precursor cleaning gas from a remote cleaning gas supply into the remote chamber where it is activated by said activation source to form a reactive cleaning species; and a second conduit configured to convey the reactive cleaning species from the remote chamber into the deposition chamber, the reactive cleaning species being operable to clean the interior of the deposition chamber to reduce the presence of white powder in the deposition chamber.

2. The apparatus of claim 1, wherein said heating means includes:

a compartment located within at least a portion of said wall;

a fluid inlet port connected to said compartment; and a fluid outlet port connected to said compartment.

3. The apparatus of claim 2, further comprising a source of fluid connected to said fluid inlet port.

4. The apparatus of claim 3, wherein said fluid is water heated to a temperature greater than or equal to about 85° C.

5. The apparatus of claim 4, wherein said water is heated to a temperature of about 85° C.

6. The apparatus of claim 1, wherein the liner covers substantially the entire interior of said deposition chamber.

7. The apparatus of claim 1, wherein the liner is made of anodized aluminum.

8. The apparatus of claim 1, wherein the liner is made of a ceramic.

9. The apparatus of claim 1, wherein said heating means is a thermally insulating blanket substantially covering the exterior of said chamber.

10. The apparatus of claim 1, wherein the deposition chamber includes a second plasma activation source configured to ignite a plasma inside the deposition chamber.

11. An apparatus for silicon nitride deposition in which the production of white powder from a plurality of hot process gases inside a chamber is reduced, comprising:

a plasma deposition chamber having walls;

a susceptor positioned inside said deposition chamber;

a heater for heating the susceptor;

a heater thermally coupled to said deposition chamber walls;

a liner covering a substantial portion of the inner surface of said deposition chamber walls and in thermal contact therewith, said liner covering said deposition chamber walls such that said liner is heated by conduction from said hot process gases, by radiation and convection from said susceptor, and from said deposition chamber walls when heated by the heater, said liner thermally coupled to the walls;

a remote chamber disposed outside of and spaced apart from said deposition chamber;

a plasma activation source adapted to deliver energy into said remote chamber;

a first conduit configured to convey a precursor cleaning gas from a remote cleaning gas supply into the remote chamber where it is activated by said activation source to form a reactive cleaning species, and a second conduit configured to convey the reactive cleaning species from the remote chamber into the deposition chamber, the reactive cleaning species being operable to clean the interior of the deposition chamber to reduce the presence of white powder in the deposition chamber.

12. The apparatus of claim 11, wherein the deposition chamber includes a second plasma activation source configured to ignite a plasma inside the deposition chamber.

13. An apparatus for silicon nitride deposition in which the production of white powder from a plurality of hot process gases inside a chamber is reduced, comprising:

a plasma deposition chamber having walls;

a susceptor positioned inside said deposition chamber;

a heater for heating the susceptor;

a thermal blanket thermally coupled to the outside of said deposition chamber walls;

a liner covering a substantial portion of an inner surface of said deposition chamber walls and in thermal contact therewith such that said liner is heated by conduction from said hot process gases, by radiation and convection from said susceptor, and from said deposition chamber walls when heated;

a remote chamber disposed outside of and spaced apart from said deposition chamber;

a plasma activation source adapted to deliver energy into said remote chamber;

a first conduit configured to convey a precursor cleaning gas from a remote cleaning gas supply into the remote chamber where it is activated by said activation source to form a reactive cleaning species; and a second conduit configured to convey the reactive cleaning species from the remote chamber into the deposition chamber, the reactive cleaning species being operable to clean the interior of the deposition chamber to reduce the presence of white powder in the deposition chamber.

14. The apparatus of claim 13, wherein the deposition chamber includes a second plasma activation source configured to ignite a plasma inside the deposition chamber.

15. An apparatus for depositing films onto a substrate, comprising a deposition chamber having inner wall surfaces;

a first plasma activation source configured to ignite a plasma inside the deposition chamber;

a liner disposed inside the deposition chamber and configured to shield a substantial portion of the inner wall surfaces of the deposition chamber from deposition gases introduced into the deposition chamber;

a heater configured to heat the liner;

a remote chamber disposed outside of and spaced apart from the deposition chamber;

a second plasma activation source configured to ignite a plasma inside the deposition chamber; and a conduit coupled between the deposition chamber and the remote chamber.

* * * * *